United States Patent
Chen et al.

(10) Patent No.: US 6,657,496 B2
(45) Date of Patent: Dec. 2, 2003

(54) AMPLIFIER CIRCUIT WITH REGENERATIVE BIASING

(75) Inventors: Robert Kuo-Wei Chen, North Andover, MA (US); John C. Gammel, Birdsboro, PA (US); Joseph H. Havens, Pinckney, MI (US); Dewayne Alan Spires, Plaistow, NH (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 10/001,274

(22) Filed: Nov. 19, 2001

(65) Prior Publication Data

US 2003/0102919 A1 Jun. 5, 2003

(51) Int. Cl.[7] .................................................. H03F 3/18
(52) U.S. Cl. ........................ 330/263; 330/265; 330/267
(58) Field of Search ................................ 330/263, 265, 330/267, 285, 288

(56) References Cited

U.S. PATENT DOCUMENTS

| | | | | |
|---|---|---|---|---|
| 5,418,495 A | * | 5/1995 | Harvey | 330/265 |
| 5,578,967 A | * | 11/1996 | Harvey | 330/263 |
| 5,589,798 A | * | 12/1996 | Harvey | 330/263 |
| 5,614,866 A | * | 3/1997 | Dow | 330/267 |
| 6,268,769 B1 | * | 7/2001 | Yamauchi et al. | 330/255 |
| 6,429,744 B2 | * | 8/2002 | Murray et al. | 330/267 |

OTHER PUBLICATIONS

Alan B. Grebene, "Bipolar and MOS Analog Integrated Circuit Design," John Wiley & Sons, pp. 215–246, 1984.
Paul R. Gray et al., "Analysis and Design of Analog Integrated Circuits," Second Edition, John Wiley & Sons, pp. 233–246, 1984.

* cited by examiner

*Primary Examiner*—Henry Choe
(74) *Attorney, Agent, or Firm*—Steve Mendelsohn

(57) ABSTRACT

An amplifier having an improved output current drive capability includes an input stage and an output stage. An input of the output stage is operatively coupled to an output of the input stage. The amplifier further includes a current regeneration circuit operatively coupled to the input of the output stage in a feedback arrangement, the current regeneration circuit feeding back a current to the output circuit in accordance with a predetermined scale factor, the fed back current being proportional to an input current supplied to the output stage. The input current supplied to the output stage is dynamically adjustable by the current regeneration circuit in response to an input current requirement at the output stage.

24 Claims, 2 Drawing Sheets

AMPLIFIER CIRCUIT WITH REGENERATIVE BIASING

FIELD OF THE INVENTION

The present invention relates generally to amplifiers, and more particularly relates to techniques for improving an output drive capability in an output stage of an amplifier without proportionally increasing an input current requirement of the output stage.

BACKGROUND OF THE INVENTION

In certain amplifier or driver applications, such as, for example, in an asymmetric digital subscriber line (ADSL) system, the output current and voltage requirements may be too high for conventional complementary metal-oxide-semiconductor (CMOS) drivers. Consequently, for such applications, bipolar drivers are typically employed. However, in order to meet the speed and/or output drive specifications required by the ADSL system, traditional ADSL drivers designed using bipolar technology generally require an output stage bias current that is large enough to supply a worst case base current to the bipolar output stage transistors. This has traditionally been accomplished by designing the driver to have a quiescent bias current which is large enough to deliver the maximum load current anticipated, which, in a typical ADSL application, may be about 600 milliamperes (mA) or more at a frequency of at least 1 megahertz (MHz).

If the current gain of the output transistors comprising the driver is large (e.g., 100), the input base current required by the driver will be relatively small. However, depending upon semiconductor fabrication process and/or temperature variations, for example, the current gain of the bipolar transistor devices may significantly decrease, and therefore the driver must be designed for such worst case current gain, thus causing the driver to dissipate an undesirable amount of quiescent current under normal operation. For instance, the worst case current gain of a typical npn transistor may be as low as about ten, while the worst case current gain of a pnp transistor can be as low as five. As the current gain of the driver output transistors decreases, the amount of input base current required to deliver the maximum load current must increase proportionally.

Conventional techniques for reducing the quiescent current in an amplifier or driver have been proposed. These techniques, however, are generally not always sufficient or fully effective, and may not be practical, feasible, or otherwise cost-effective to implement in a given application. Accordingly, there exists a need for techniques for increasing an output drive capability of an amplifier without proportionally increasing the amount of input quiescent current required by an output stage of the amplifier.

SUMMARY OF THE INVENTION

The present invention provides techniques for improving an output drive capability in an output stage of an amplifier without proportionally increasing an input quiescent current requirement of the output stage. By utilizing a current regeneration technique, the present invention essentially monitors an input bias current to the output stage and dynamically adjusts the input bias current in response to output load requirements.

In accordance with one aspect of the invention, an amplifier having an improved output current drive capability includes an input stage and an output stage. An input of the output stage is operatively coupled to an output of the input stage. The amplifier further includes a current regeneration circuit operatively coupled to the input of the output stage in a feedback arrangement, the current regeneration circuit feeding back a current to the output circuit in accordance with a predetermined scale factor, the fed back current being proportional to an input current supplied to the output stage. The input current supplied to the output stage is dynamically adjustable by the current regeneration circuit in response to an input current requirement at the output stage.

In accordance with another aspect of the invention, the amplifier includes a slew rate enhancement circuit operatively coupled to the input stage of the amplifier. The slew rate enhancement circuit preferably provides an alternate current path for charging and discharging a compensation circuit included in the amplifier for stabilizing the current regeneration circuit.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative amplifier circuit which may be used, for example, in an asynchronous digital subscriber line (ADSL) application. It should be appreciated, however, that the present invention is not limited to this or any particular amplifier circuit. Rather, the invention is more generally applicable to any suitable circuit in which it is desirable to improve an output drive capability and/or slew rate of the circuit without proportionally increasing an input bias current of the circuit. The term "amplifier" as used herein essentially refers to a circuit for multiplying an input signal applied to the circuit by a predetermined gain. Thus, an amplifier formed in accordance with the present invention may function as a buffer, for example, when the gain is set to one. Moreover, although implementations of the present invention are described herein using npn and pnp bipolar junction transistor (BJT) devices, it is to be appreciated that one or more of the transistors may be replaced by other suitable devices, such as, for example, composite npn-pnp devices or complementary metal-oxide-semiconductor (CMOS) devices, with or without modifications to the circuit, as understood by those skilled in the art.

Since metal-oxide-semiconductor (MOS) transistors are voltage-controlled devices rather than current-controlled devices, the regenerative current biasing techniques of the present invention are more suitable for use with BJT devices, at least as used in an output stage of an amplifier circuit, which generally requires a predetermined amount of base current to produce a given output current from the amplifier. Moreover, BJT devices typically have a greater current drive capability at higher frequencies (e.g., around 1 megahertz (MHz)) as compared to, for example, power CMOS devices which generally have an inherently large gate capacitance. In an ADSL application, BJT devices have a further advantage in that deep sub-micron CMOS devices, which are often employed in high-speed applications, are not well-suited for operation at relatively high power supply voltages, e.g., ten volts.

Figure 1:
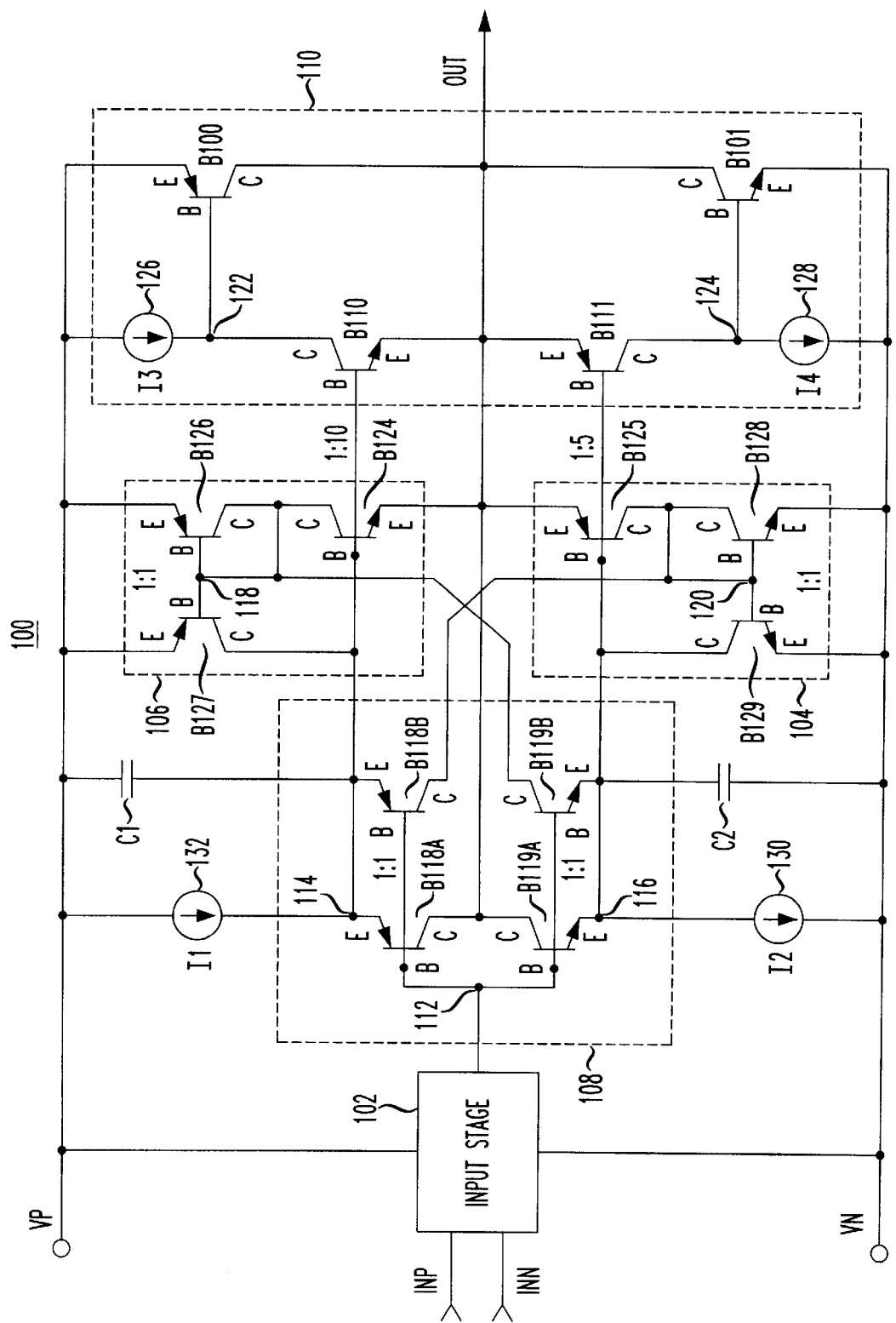
FIG. 1 is schematic diagram illustrating an exemplary amplifier including a regenerative biasing circuit, formed in accordance with the present invention.

FIG. 1 is a schematic diagram illustrating an exemplary amplifier 100 employing slew rate enhanced regenerative biasing, in accordance with one aspect of the invention. The amplifier 100 includes a non-inverting or positive input INP, an inverting or negative input INN and an output OUT. Thus, the amplifier may be considered a differential input amplifier. For ease of explanation, the exemplary amplifier 100 may be grouped according to functional sub-circuits or stages, including an input stage 102, a slew rate enhancement circuit 108, a source regeneration circuit 106, a sink regeneration circuit 104, and an output stage 110. Each of these circuits or stages is described in further detail below. It is to be appreciated that certain of these circuits may be combined or incorporated into one or more other circuits or stages. For example, the source regeneration circuit 106 and the sink regeneration circuit 104 may be incorporated into a single current regeneration circuit or into the output stage 110.

The input stage 102 is preferably a differential amplifier, such as, for example, an operational amplifier, having a differential input which forms the inputs INP, INN of the amplifier 100. Input stage 102 is operatively connected to a positive voltage supply VP and to a negative voltage supply VN, such as ground. The input stage 102 may also incorporate one or more gain stages for providing the amplifier 100 with a predetermined amount of gain. A more detailed discussion of input and gain stages that may be suitable for use with the present invention can be found, for example, in the text by Alan B. Grebene, *Bipolar and MOS Analog Integrated Circuit Design*, John Wiley & Sons, pp. 215–246 (1984), which is incorporated herein by reference. Accordingly, a detailed description of the input stage 102 will not be presented herein. It is to be appreciated that the input stage 102 is not limited to a differential input stage. Moreover, in applications where no amplification is required (e.g., a buffer), the input stage 102 may be configured to provide a gain of one.

The output stage 110 of amplifier 100 preferably includes a pair of bipolar pnp transistors B100 and B111, and a pair of bipolar npn transistors B101 and B110, each of the transistors having an emitter terminal (E), a base terminal (B) and a collector terminal (C). As will be understood by those skilled in the art, corresponding pairs of output transistors B110, B100 and B111, B101 may be formed as composite transistor devices. A composite transistor device essentially integrates a pnp transistor with an npn transistor, the composite device having a higher current gain $\beta_c$, given as $\beta_n \cdot \beta_p$, where $\beta_n$ and $\beta_p$ are the respective current gains of the npn and pnp transistors comprising the composite transistor. Transistors B100 and B110 may be viewed as constituting a current source portion of the output stage 110 and transistors B101 and B111 may be viewed as constituting a current sink portion of the output stage. Output transistors B110 and B111 are preferably coupled in a complementary or quasi-complementary Class AB configuration, as described below.

With regard to the current source portion of output stage 110, transistors B100, B110 are configured such that a current gain from the base terminal of transistor B110 to the output OUT of the amplifier 100 is given as $\beta_{B110} \cdot \beta_{B100}$, where $\beta_{B110}$ and $\beta_{B100}$ are the current gains of transistors B110 and B100, respectively. Specifically, the emitter terminal of transistor B110 and the collector terminal of transistor B100 are coupled to the output OUT of the amplifier, the emitter terminal of transistor B100 is coupled to the positive voltage supply VP, and the base terminal of transistor B100 is coupled to the collector terminal of transistor B110 at node 122.

A bias circuit 126, which may be implemented as a constant current source as shown, is connected between the positive voltage supply VP and node 122 and supplies a bias current I3 for biasing transistors B100, B110 to a predetermined direct current (DC) quiescent operating point. The bias circuit 126 may be, for example, a simple resistor or it may be an active device, such as, but not limited to, a transistor coupled to an appropriate bias voltage source (not shown) in a conventional fashion. Furthermore, the bias circuit 126 may be configured to provide temperature-dependent biasing. This can be accomplished, for example, by including a bias voltage generator circuit (not shown) in amplifier 100 which produces a bias voltage which varies proportionally with temperature. In this manner, the amplifier may exhibit a substantially constant transconductance over a given temperature range.

Similarly, with regard to the current sink portion of output stage 110, transistors B101, B111 are configured such that a current gain from the base terminal of transistor B111 to the output OUT of the amplifier 100 is given by $\beta_{B111} \cdot \beta_{B101}$, where $\beta_{B111}$ and $\beta_{B101}$ are the current gains of transistors B111 and B101, respectively. Specifically, the emitter terminal of transistor B111 and the collector terminal of transistor B101 are coupled to the output OUT of the amplifier, the emitter terminal of transistor B101 is coupled to the negative voltage supply VN, and the base terminal of transistor B101 is coupled to the collector terminal of transistor B111 at node 124. A bias circuit 128, depicted as a conventional constant current sink, is connected between node 124 and the negative voltage supply VN and supplies a bias current I4 for biasing transistors B101, B111 to a predetermined DC quiescent operating point. Bias circuit 124 may be formed in a manner consistent with bias circuit 126 previously described.

With continued reference to FIG. 1, the base current for transistors B110 and B111 is preferably supplied, at least in part, by bias circuits 132 and 130, respectively, which are depicted as conventional current sources. Bias circuit 132 is configured as a constant current source connected between the positive voltage supply VP and the base terminal of transistor B110 at node 114 and supplies a bias current I1 for biasing transistor B110 to a predetermined DC quiescent operating point. Similarly, bias circuit 130 is configured as a constant current sink connected between the base terminal of transistor B111 at node 116 and the negative voltage supply VN and supplies a bias current I2 for biasing transistor B111 to a predetermined DC quiescent operating point. The value of bias currents I1 and I2 will depend, at least in part, upon the quiescent operating point of the output stage transistors B110, B111.

With specific regard to transistor B110, the base current I1 supplied by bias circuit 132 is dynamically enhanced by source regeneration circuit 106 operatively coupled to the base terminal of transistor B110. The source regeneration circuit 106 preferably comprises an npn transistor B124 and two pnp transistors B126, B127, each of the transistors having an emitter terminal (E), a base terminal (B) and a collector terminal (C). The emitter and base terminals of transistor B124 are coupled to the emitter and base terminals, respectively, of output transistor B110 such that transistor B124 mirrors at least a portion of the collector current of transistor B110 in accordance with a predetermined ratio. The emitter areas of transistors B124 and B110 are scaled by the predetermined ratio, such as, for example, 1:10 as shown in FIG. 1. The ratio is preferably chosen to substantially match a worst case current gain of corresponding transistor B110, which may be as low as about ten. By matching the ratio to the anticipated worst case current gain of transistor B110, transistor B124 will produce a reference current through its collector terminal which closely approximates the worst case base current required by transistor B110 to source a given output load current.

The collector current of transistor B124, which, as previously stated, approximates the required worst case base current of transistor B110, is mirrored by transistors B126, B127 which are configured as a conventional simple two-transistor current mirror. Specifically, transistor B126 is connected in a diode arrangement, with the collector terminal of transistor B126 coupled to its base terminal at node 118. The collector terminal of transistor B126 is coupled to the collector terminal of transistor B124, and the emitter terminal of transistor B126 is connected to the positive voltage supply VP. Transistor B127 is connected so that its emitter terminal is coupled to positive voltage supply VP and its base terminal is coupled to the base terminal of transistor B126 at node 118. The collector terminal of transistor B127 is connected to the base terminal of transistor B110 such that the mirrored reference current in transistor B124 is operatively fed back to the base terminal of transistor B110. Various conventional alternative current mirrors, such as, for example, a Wilson or Widlar current mirror, as understood by those skilled in the art, may also be employed by the present invention. A more detailed description of such current mirrors may be found, for example, in the text by Paul R. Gray and Robert G. Meyer, *Analysis and Design of Analog Integrated Circuits, Second Edition*, John Wiley & Sons, pp. 233–246(1984), which is incorporated herein by reference.

Preferably, the emitter areas of transistors B126 and B127 are scaled to be substantially matched to one another (i.e., an emitter area ratio of 1:1). The present invention, however, contemplates that the emitter area ratio between transistors B126 and B127 may be chosen to be any number n (e.g., n:1), where n is greater than zero. In this instance, the emitter area ratio between transistors B124 and B110 should also be adjusted, such as, for example, 1:10n.

By way of illustration, as the output load current sourced by the amplifier 100 increases, the collector current in transistor B110 also increases which, in turn, increases the reference collector current in transistor B124 by substantially the same proportion. Increasing the collector current in transistor B124 increases the current in the mirror comprised of transistors B126 and B127. The current in transistor B127 is then fed back to the base terminal of transistor B110. Thus, the load current regenerates itself in the form of input base current such that the output stage 110 never starves due to a lack of base current drive. Moreover, a large quiescent current from bias circuit 132 is not required since the base current for transistor B110 is generated dynamically by the source regeneration circuit 106. Consequently, bias circuit 132 may be advantageously designed with a significantly smaller current than if source regeneration stage 106 were not present in the amplifier 100.

With continued reference to FIG. 1, the sink regeneration circuit 104 may be implemented in a manner consistent with the source regeneration circuit 106 described above. Regarding output transistor B111, the base current 12 supplied by bias circuit 130 is dynamically enhanced by sink regeneration circuit 104 which is operatively coupled to the base terminal of transistor B111. The sink regeneration circuit 104 preferably comprises a pnp transistor B125 and two npn transistors B128, B129, each of the transistors having an emitter terminal (E), a base terminal (B) and a collector terminal (C). The emitter and base terminals of transistor B125 are coupled to the emitter and base terminals, respectively, of output transistor B111 such that transistor B125 mirrors at least a portion of the collector current of transistor B111 in accordance with a predetermined ratio. The emitter areas of transistors B125 and B111 are scaled by the predetermined ratio, which, in the exemplary amplifier 100, is selected to be 1:5.

As in the case for transistors B124 and B110 described above, the emitter area ratio between transistors B125 and B111 is preferably chosen to substantially reflect an anticipated worst case current gain of output transistor B111. Since transistor B111 is a pnp-type device, the worst case current gain may be as low as about five. By substantially matching the emitter area ratio to the anticipated worst case current gain of transistor B111, a reference collector current in transistor B125 will closely approximate the base current required by transistor B111 to supply a given output load current. It is to be appreciated that since the worst case current gain for a pnp transistor may be different from the worst case current gain for an npn transistor operating at a similar quiescent bias point, the emitter area ratio between the source regeneration circuit 106 and the source output transistor B110 may not necessarily be the same as the emitter area ratio between the sink regeneration circuit 104 and the sink output transistor B111.

The collector current of transistor B125, which, as previously stated, approximates the required base current of transistor B111, is mirrored by transistors B128, B129 which are configured as a conventional simple current mirror. Specifically, transistor B128 is connected in a diode arrangement, with the collector terminal of transistor B128 coupled to its base terminal at node 120. Various alternative current mirror arrangements are also contemplated by the present invention. The collector terminal of transistor B128 is coupled to the collector terminal of transistor B125, and the emitter terminal of transistor B128 is connected to the negative voltage supply VN. Transistor B129 is coupled so that its emitter terminal is coupled to the negative voltage supply VN and its base terminal is coupled to the base terminal of transistor B128 at node 120. The collector terminal of transistor B129 is connected to the base terminal of transistor B111, such that the mirrored reference collector current in transistor B125 is fed back to the base terminal of transistor B111 in a manner consistent with that previously explained in connection with transistor B110.

Preferably, the emitter areas of transistors B128 and B129 are scaled to be substantially matched to one another (i.e., an emitter area ratio of 1:1), as in the case of transistors B126, B127. The present invention, however, contemplates that the emitter area ratio between transistors B128 and B129 may be chosen to be any number n (e.g., n:1), where n is a predetermined number greater than zero. In this instance, the emitter area ratio between transistors B125 and B111 must also be adjusted, such as, for example, 1:5·n. It is to be appreciated that the emitter area ratio between transistors B128, B129 is not dependent upon the emitter area ratio between transistors B126, B127.

By way of illustration, as the output load current sunk by the amplifier 100 increases, the collector current in transistor B111 also increases which, in turn, increases the collector current in transistor B125 by the same proportion. Increasing the collector current in transistor B125 similarly increases the current in the mirror comprised of transistors B128, B129. The current in transistor B129 is fed back to the base terminal of transistor B111. Thus, the load current regenerates itself in the form of input base current such that the output stage 110 never starves due to a lack of base current. Consequently, bias circuit 130 may be advantageously designed with a significantly smaller current than if sink regeneration circuit 104 were not present in the amplifier 100.

Referring again to FIG. 1, in order to stabilize the feedback loop in both the source regeneration circuit 106 and the sink regeneration circuit 104, a compensation circuit comprised, for example, of capacitors C1 and C2, is preferably included in amplifier 100, capacitor C1 being coupled between the positive voltage supply VP and the base terminal of transistor B110 at node 114, and capacitor C2 being coupled between the base terminal of transistor B111 at node 116 and the negative voltage supply VN. Without the use of such compensation circuit, the source and sink regeneration circuits may produce undesirable frequency peaking and/or oscillation at certain high frequencies. A preferred value for compensation capacitors C1, C2 for use with the exemplary amplifier 100 is from about 10 picofarad (pF) to about 30 pF, and, more preferably, is about 17 pF. It is to be appreciated that compensation capacitors C1, C2 do not have to be matched to one another, since each compensation capacitor C1, C2 corresponds to a separate feedback loop to be compensated. In fact, compensation capacitors C1 and C2 may be different in value due, at least in part, to differences in the small signal characteristics of the two regeneration circuits 104, 106.

Under certain conditions, particularly when large output signal swings at high frequency (e.g., about 1 MHz) are required, the output stage 110 may exhibit a nonlinear or unsymmetrical response, and thus the output signal may have higher distortion than is desirable. This nonlinearity may be attributed, at least in part, to a decreased slew rate as a result of the compensation circuit and/or capacitive load coupled to the output stage 110. In order to increase the slew rate of the exemplary amplifier 100, which is typically defined as the maximum output voltage rate, either positive or negative, a slew rate enhancement circuit 108 is preferably included in the amplifier. The slew rate of amplifier 100 is determined by the amount of current that can be sourced or sunk into an output/compensation capacitor. With respect to the compensation capacitors C1, C2, as the compensation capacitance increases in value, the slew rate of the amplifier will decrease proportionally. Consequently, the slew rate enhancement circuit 108 preferably provides an alternate current path for charging and discharging the compensation capacitors C1, C2. This alternate path preferably operates in a Class AB mode, that is, it comes into conduction primarily when large signal swings are involved. The present invention contemplates various other slew rate enhancement techniques.

As shown in FIG. 1, the slew rate enhancement circuit 108 includes a pair of pnp transistors B118A, B118B and a pair of npn transistors B119A, B119B, each having an emitter terminal (E), a base terminal (B) and a collector terminal (C). The base terminals of each of the transistors B118A, B118B, B119A, B119B form an input of the slew rate enhancement circuit 108 which is coupled to an output of the input stage 102 at node 112. The emitter terminals of transistors B118A and B118B are coupled together at node 114. Similarly, the emitter terminals of transistors B119A and B119B are coupled together at node 116. Each of the corresponding transistors B118A, B118B and B119A, B119B in a given pair of transistors are ideally matched, at least in terms of emitter area (i.e., an emitter area ratio of 1:1). The collector terminals of transistors B118A and B119A are coupled together to the output OUT of the amplifier, while the collector terminals of transistors B118B and B119B are connected in a cross-coupled arrangement to the sink regeneration stage and source regeneration stage at nodes 120 and 118, respectively. Specifically, the collector terminal of transistor B118B is coupled to the base and collector terminals of diode-connected transistor B128, and the collector terminal of transistor B119B is coupled to the base and collector terminals of diode-connected transistor B126.

By way of illustration, consider a positive voltage ramp presented at the input of the slew rate enhancement circuit 108 at node 112. As the voltage at node 112 increases, the emitter voltage of transistors B119A, B119B will increase by essentially the same amount, since the base-emitter voltage of a bipolar transistor is relatively constant, despite small changes in current through the transistor. Assuming the voltage across compensation capacitor C2 was initially zero, if the voltage at node 112 increases rapidly, the current produced by transistors B119A, B119B will increase significantly, thereby rapidly charging capacitor C2. Half of the charging current attributed to transistor B119B will be pulled from the current mirror comprising transistors B126, B127 in source regeneration stage 106, thereby rapidly discharging compensation capacitor C1 by the collector current in transistor B127. The opposite holds true when considering a negative voltage ramp presented at node 112. Accordingly, the slew rate enhancement circuit 108 increases the slew rate of the amplifier 100 without substantially increasing the quiescent bias current of the amplifier and without compromising the stability of the amplifier by requiring a smaller value compensation capacitor.

Figure 2:
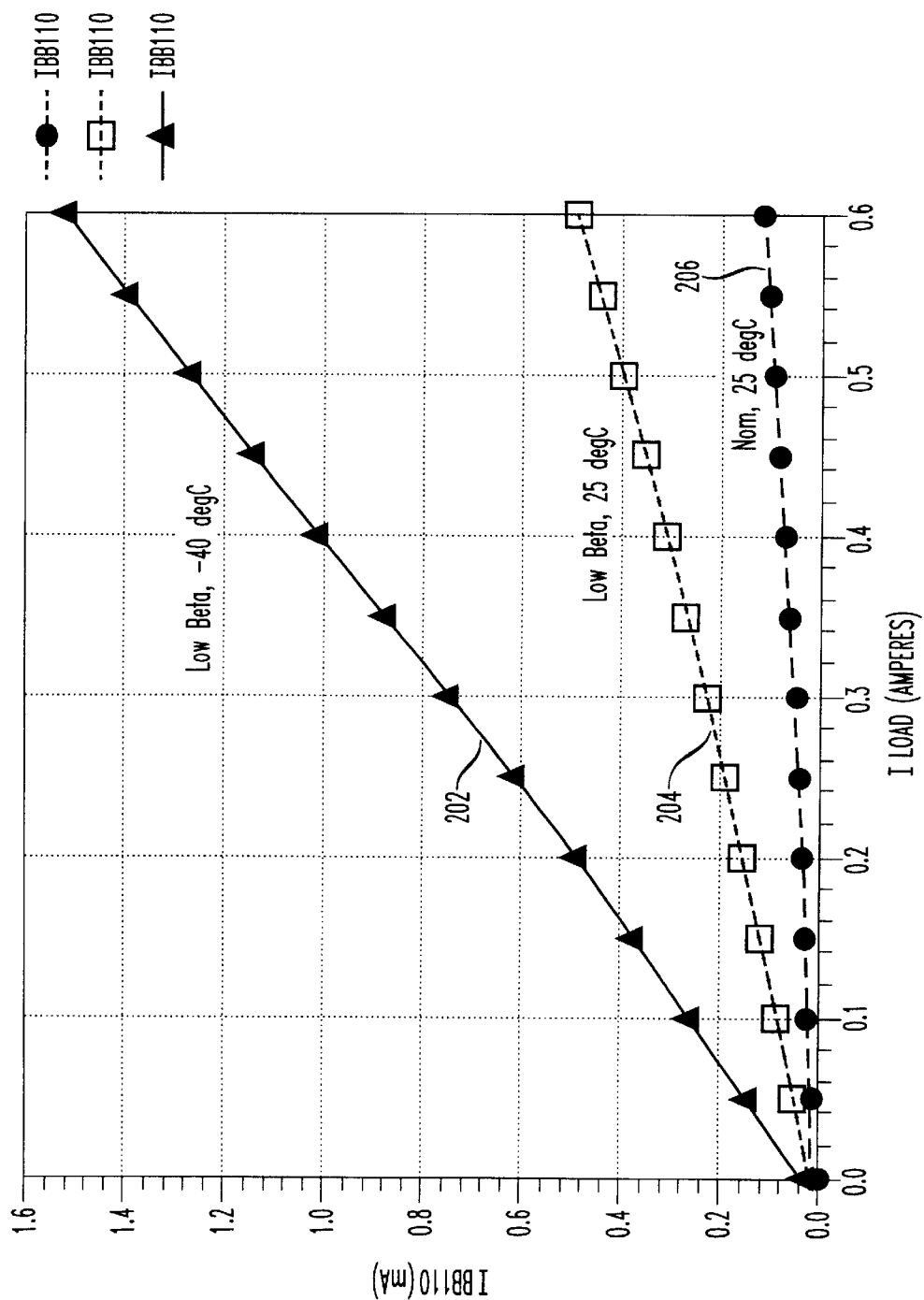
FIG. 2 is a graphical representation illustrating a relationship between output load current and input current in an amplifier in accordance with the invention.

With reference now to FIG. 2, a graphical representation is shown illustrating a relationship between the base current (IBB110) of output transistor B110 (y-axis) and the output current (ILOAD) for the exemplary amplifier 100 (x-axis). As is apparent from the figure, when the output current is 600 mA, the worst case input base current required for output transistor B110 is about 1.5 mA, which occurs with low current gain (beta) transistors at low temperature (e.g., −40 ° degrees Celsius), as shown by curve 202. Even at 25 ° degrees Celsius, the base current required to output 600 mA is about 0.5 mA, as shown by curve 204. Without the source and sink regeneration stages of the present invention, the bias circuit 132 (see FIG. 1) must generate a current I1 of at least 1.5 mA in order for the output stage to function properly during worst case conditions. Using the current regeneration techniques of the present invention described herein, the bias current I1 can be as low as 100 microamperes ($\mu$A) and still produce the same output current of 600 mA, thus saving 1.4 mA of quiescent current. This is shown by curve 206 on the graph of FIG. 2.

Although illustrative embodiments of the present invention have been described herein with reference to the accompanying drawings, it is to be understood that the invention is not limited to those precise embodiments, and that various other changes and modifications may be made therein by one skilled in the art without departing from the scope or spirit of the invention.

What is claimed is:

1. An amplifier having an improved output drive, the amplifier comprising:

an input stage having an input and an output;

an output stage having an input and an output, the input of the output stage being operatively coupled to the output of the input stage; and a current regeneration circuit operatively coupled to the input of the output stage in a feedback arrangement, the current regeneration circuit including a feedback loop adapted to feed back a current to the output stage in accordance with a predetermined scale factor, the fed back current being proportional to an input current supplied to the output stage, whereby the input current supplied to the output stage is dynamically adjustable by the current regeneration circuit in response to an input current requirement at the output stage.

2. The amplifier of claim 1, further comprising:

a compensation circuit coupled to the current regeneration circuit, the compensation circuit being adapted to operatively stabilize the feedback loop in the current regeneration circuit within a predetermined frequency range of operation.

3. The amplifier of claim 2, further comprising:

a slew rate enhancement circuit operatively coupled to the compensation circuit, the slew rate enhancement circuit being adapted to increase a slew rate of the amplifier circuit.

4. The amplifier of claim 1, wherein:

the input stage comprises an operational amplifier including a noninverting input and an inverting input, the noninverting and inverting inputs forming a differential input of the amplifier circuit.

5. The amplifier of claim 1, wherein:

the output stage comprises a pair of bipolar transistors operatively coupled together in a complementary Class AB configuration.

6. The amplifier of claim 1, wherein the output stage comprises:

first and second pnp transistors and first and second npn transistors, each of the transistors having an emitter terminal, a base terminal, and a collector terminal, the emitter terminals of the first pnp and first npn transistors and the collector terminals of the second pnp and second npn transistors being coupled together and forming the output of the amplifier circuit, the emitter terminal of the second pnp transistor being coupled to a positive voltage supply, the emitter terminal of the second npn transistor being coupled to a negative voltage supply, the base terminal of the second pnp transistor being coupled to the collector terminal of the first npn transistor, the base terminal of the second npn transistor being coupled to the collector terminal of the first pnp transistor, the base terminals of the first npn and pnp transistors forming first and second inputs of the output stage; and first and second bias circuits, the first bias circuit being coupled between the collector terminal of the first npn transistor and the positive voltage supply, and the second bias circuit being coupled between the collector terminal of the first pnp transistor and the negative voltage supply.

7. The amplifier of claim 1, wherein the current regeneration circuit comprises:

a source regeneration circuit including first, second and third bipolar transistors, each of the transistors having an emitter terminal, a base terminal, and a collector terminal, the first bipolar transistor being configured so as to generate a reference current through its collector terminal which substantially approximates an anticipated worst case base current required by the output stage when sourcing current to a load coupled to the output stage, the second and third bipolar transistors being coupled together in a mirror arrangement and being configured to operatively feedback at least a portion of the reference current from the first bipolar transistor to the output stage; and a sink regeneration circuit including first, second and third bipolar transistors, each of the transistors having an emitter terminal, a base terminal, and a collector terminal, the first bipolar transistor being configured so as to generate a reference current through its collector terminal which substantially approximates an anticipated worst case base current required by the output stage when sinking current from the load coupled to the output stage, the second and third bipolar transistors being coupled together in a mirror arrangement and being configured to operatively feedback at least a portion of the reference current from the first bipolar transistor to the output stage.

8. The amplifier of claim 3, wherein:

the compensation circuit comprises a compensation capacitor; and the slew rate enhancement circuit provides an alternative current path for charging and discharging the compensation capacitor.

9. The amplifier of claim 3, wherein the slew rate enhancement circuit comprises:

a first, second, third and fourth bipolar transistor, each of the transistors having an emitter terminal, a base terminal, and a collector terminal, the base terminals of each of the transistors being coupled to the output of the input stage, the collector terminal of the first bipolar transistor and the collector terminal of the third bipolar transistor being coupled to the output of the amplifier, and the collector terminals of the second and fourth bipolar transistors being operatively connected in a cross-coupled configuration to the current regeneration circuit for providing the alternative current path for charging and discharging the compensation capacitor.

10. The amplifier of claim 1, wherein the feedback loop is an internal feedback loop that is internal to the amplifier.

11. An integrated circuit including at least one amplifier comprising:

an input stage having an input and an output;

an output stage having an input and an output, the input of the output stage being operatively coupled to the output of the input stage; and a current regeneration circuit operatively coupled to the input of the output stage in a feedback arrangement, the current regeneration circuit including a feedback loop adapted to feed back a predetermined current to the output stage, the predetermined current being proportional to an input current supplied to the output stage, whereby the input current supplied to the output stage is dynamically adjustable by the current regeneration circuit in response to an input current requirement at the output stage.

12. The integrated circuit of claim 11, wherein the at least one amplifier further comprises:

a compensation circuit coupled to the current regeneration circuit, the compensation circuit being adapted to operatively stabilize the feedback loop in the current regeneration circuit within a predetermined frequency range of operation.

13. The integrated circuit of claim 12, wherein the at least one amplifier further comprises:

a slew rate enhancement circuit operatively coupled to the compensation circuit, the slew rate enhancement circuit being adapted to increase a slew rate of the at least one amplifier.

14. The integrated circuit of claim 11, wherein:

the input stage of the at least one amplifier comprises an operational amplifier including a noninverting input and an inverting input, the noninverting and inverting inputs forming a differential input of the integrated circuit.

15. The integrated circuit of claim 11, wherein:

the output stage of the at least one amplifier comprises a pair of bipolar transistors operatively coupled together in a complementary Class AB configuration.

16. The integrated circuit of claim 11, wherein the output stage of the at least one amplifier comprises:

first and second pnp transistors and first and second npn transistors, each of the transistors having an emitter terminal, a base terminal, and a collector terminal, the emitter terminals of the first pnp and first npn transistors and the collector terminals of the second pnp and second npn transistors being coupled together and forming the output of the integrated circuit, the emitter terminal of the second pnp transistor being coupled to a positive voltage supply, the emitter terminal of the second npn transistor being coupled to a negative voltage supply, the base terminal of the second pnp transistor being coupled to the collector terminal of the first npn transistor, the base terminal of the second npn transistor being coupled to the collector terminal of the first pnp transistor, the base terminals of the first npn and pnp transistors forming first and second inputs of the output stage; and first and second bias circuits, the first bias circuit being coupled between the collector terminal of the first npn transistor and the positive voltage supply, and the second bias circuit being coupled between the collector terminal of the first pnp transistor and the negative voltage supply.

17. The integrated circuit of claim 11, wherein the current regeneration circuit comprises:

a source regeneration circuit including a first, a second and a third bipolar transistor, each of the transistors having an emitter terminal, a base terminal, and a collector terminal, the first bipolar transistor being configured so as to generate a reference current through its collector terminal which substantially approximates an anticipated worse case base current required by the output stage when sourcing current to a load coupled to the output stage, the second and third bipolar transistors being coupled together in a mirror arrangement and being configured to operatively feedback at least a portion of the reference current from the first bipolar transistor to the output stage; and a sink regeneration circuit including first, second and third bipolar transistors, each of the transistors having an emitter terminal, a base terminal, and a collector terminal, the first bipolar transistors being configured so as to generate a reference current through its collector terminal which substantially approximates an anticipated worst case base current required by the output stage when sinking current from the load coupled to the output stage, the second and third bipolar transistors being coupled together in a mirror arrangement and being configured to operatively feedback at least a portion of the reference current from the first bipolar transistor to the output stage.

18. The integrated circuit of claim 13, wherein:

the compensation circuit comprises a compensation capacitor; and the slew rate enhancement circuit provides an alternative current path for charging and discharging the compensation capacitor.

19. The integrated circuit of claim 13, wherein the slew rate enhancement circuit comprises:

a first, second, third and fourth bipolar transistor, each of the transistors having an emitter terminal, a base terminal, and a collector terminal, the base terminals of each of the transistors being coupled to the output of the input stage, the collector terminal of the first bipolar transistor and the collector terminal of the third bipolar transistor being coupled to the output of the amplifier, and the collector terminals of the second and fourth bipolar transistors being operatively connected in a cross-coupled configuration to the current regeneration circuit for providing the alternative current path for charging and discharging the compensation capacitor.

20. The integrated circuit of claim 11, wherein the feedback loop is an internal feedback loop that is internal to the amplifier.

21. A method for improving an output drive capability in an output stage of an amplifier circuit without proportionally increasing a quiescent current in the amplifier circuit, the method comprising the steps of:

determining an input current requirement of the output stage of the amplifier circuit, the input current requirement being a least partially dependent upon a load coupled to the output stage;

generating a current that is proportional to the input current requirement of the output stage; and feeding back at least a portion of the generated current to an input of the output stage, whereby an input current supplied to the output stage is dynamically adjustable in response to the input current requirement at the output stage.

22. The method of claim 21, further comprising the step of:

compensating a feedback loop in the output stage for stabilizing the output stage within a predetermined frequency range of operation.

23. The method of claim 21, further comprising the step of:

enhancing a slew rate of the output stage.

24. The method of claim 21, wherein the portion of the generated current is fed back to the input of the output stage is fed back internal to the amplifier.

* * * * *

UNITED STATES PATENT AND TRADEMARK OFFICE
CERTIFICATE OF CORRECTION

PATENT NO. : 6,657,496 B2
DATED : December 2, 2003
INVENTOR(S) : Robert Kuo-Wei Chen et al.

It is certified that error appears in the above-identified patent and that said Letters Patent is hereby corrected as shown below:

<u>Column 12,</u>
Line 47, after the word "stage" add -- , the amplifier circuit further comprising a current regeneration circuit which includes a feedback loop adapted to feedback current to the output stage and the fed back current being proportional to an input current supplied to the output stage --.

Signed and Sealed this

Twenty-fifth Day of May, 2004

JON W. DUDAS
*Acting Director of the United States Patent and Trademark Office*